(12) United States Patent
Huang

(10) Patent No.: US 8,976,620 B2
(45) Date of Patent: Mar. 10, 2015

(54) APPARATUS AND METHOD TO ADJUST CLOCK DUTY CYCLE OF MEMORY

(71) Applicant: MediaTek Inc., Hsin-Chu (TW)

(72) Inventor: Hsiang-I Huang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/159,803

(22) Filed: Jan. 21, 2014

(65) Prior Publication Data

US 2014/0133248 A1    May 15, 2014

Related U.S. Application Data

(62) Division of application No. 13/076,023, filed on Mar. 30, 2011, now Pat. No. 8,665,665.

(51) Int. Cl.
| | |
|---|---|
| *G11C 8/18* | (2006.01) |
| *G11C 11/409* | (2006.01) |
| *G11C 7/10* | (2006.01) |
| G11C 29/02 | (2006.01) |
| G11C 29/50 | (2006.01) |

(52) U.S. Cl.
CPC ............ *G11C 11/409* (2013.01); *G11C 7/1066* (2013.01); *G11C 29/028* (2013.01); *G11C 29/50012* (2013.01)
USPC ...................................... 365/233.12; 365/193

(58) Field of Classification Search
USPC ........... 365/233.1, 233.12, 193, 191; 327/175
See application file for complete search history.

(56) References Cited

U.S. PATENT DOCUMENTS

| | | | |
|---|---|---|---|
| 5,946,712 A | 8/1999 | Lu et al. | |
| 7,199,634 B2 | 4/2007 | Cho et al. | |
| 7,203,860 B2 * | 4/2007 | Ishida et al. | 713/503 |
| 7,292,082 B2 * | 11/2007 | Nam et al. | 327/175 |
| 7,317,341 B2 * | 1/2008 | Cho | 327/175 |
| 2002/0017936 A1 * | 2/2002 | Stark et al. | 327/175 |
| 2004/0075462 A1 | 4/2004 | Kizer et al. | |
| 2005/0058233 A1 | 3/2005 | Nguyen et al. | |
| 2007/0046346 A1 * | 3/2007 | Minzoni | 327/158 |
| 2007/0182470 A1 * | 8/2007 | Heyne | 327/158 |

(Continued)

FOREIGN PATENT DOCUMENTS

| | | |
|---|---|---|
| CN | 1410978 A | 4/2003 |
| CN | 1722615 A | 1/2006 |

(Continued)

OTHER PUBLICATIONS

Full English (machine) translation of CN1410978 (Published Apr. 16, 2003).

(Continued)

*Primary Examiner* — Douglas King
(74) *Attorney, Agent, or Firm* — McClure, Qualey & Rodack, LLP

(57) ABSTRACT

An embodiment of the invention provides a memory controller for controlling a memory. The memory controller comprises a pulse width modulation module, a voltage comparator and a duty cycle calibration device. The pulse width modulation module is suitable for receiving a clock signal to generate a first voltage. The voltage comparator is suitable for receiving and comparing a reference voltage with the first voltage to output a comparison signal. The duty cycle calibration device is suitable for adjusting a duty cycle of the clock signal according to the comparison signal.

9 Claims, 11 Drawing Sheets

(56) References Cited

U.S. PATENT DOCUMENTS

| | | |
|---|---|---|
| 2007/0216457 A1 | 9/2007 | Agarwal et al. |
| 2009/0146715 A1 | 6/2009 | Jiang |
| 2010/0164580 A1* | 7/2010 | Boerstler et al. ............ 327/175 |

FOREIGN PATENT DOCUMENTS

| | | |
|---|---|---|
| CN | 201349178 Y | 11/2009 |
| CN | 101667450 A | 3/2010 |

OTHER PUBLICATIONS

Full English (machine) translation of CN1722615 (Published Jan. 18, 2006).

English Abstract translation of CN101667450 (Published Mar. 10, 2010).

English Abstract translation of CN201349178 (Published Nov. 18, 2009).

* cited by examiner

APPARATUS AND METHOD TO ADJUST CLOCK DUTY CYCLE OF MEMORY

CROSS REFERENCE TO RELATED APPLICATIONS

This application is a divisional application of U.S. application Ser. No 13/076,023, filed Mar. 30, 2011, now U.S. Pat. No. 8,665,665, the contents of which are incorporated herein by reference.

BACKGROUND OF THE INVENTION

1. Field of the Invention

The invention relates to a memory controller, and more particularly, to a memory controller with a clock duty cycle adjusting mechanism.

2. Description of the Related Art

When a dynamic random access memory (DRAM) controller accesses a DRAM, the DRAM controller transmits a clock signal to the DRAM and the DRAM sends back a DQS signal to the DRAM controller for sampling the data signal DQ. The sampling signal DQS is generated based on the clock signal and if the quality of the clock signal, such as the duty cycle, is not good enough, the data acquired by the DRAM controller may be faulty.

FIG. 1 is a timing diagram showing a DDR DRAM read operation with a balanced clock duty cycle. In FIG. 1, the duty cycle of the clock signal transmitted to the DRAM is 50%, such that the signal DQS is driven by the clock signal with a duty cycle of 50%. Accordingly, an optimal timing margin is achieved.

FIG. 2 is a timing diagram showing a DDR DRAM read operation with an unbalanced clock duty cycle. In this example, the duty cycle of the clock signal transmitted to the DRAM is smaller than 50%, such that the signal DQS is driven by the clock signal with a duty cycle of less than 50%. Accordingly, the DRAM controller may not acquire the correct signal DQ and an optimal timing margin is not achieved. Note that the timing margin of the signal DQ varies according to the magnitude of the duty cycle, and if the timing margin is smaller than a predetermined value, such at those found at parts A and C of FIG. 2, the DRAM controller may not acquire correct data.

BRIEF SUMMARY OF THE INVENTION

An embodiment of the invention provides a memory controller for controlling a memory. The memory controller comprises a pulse width modulation module, a voltage comparator and a duty cycle calibration device. The pulse width modulation module is suitable for receiving a clock signal to generate a first voltage. The voltage comparator is suitable for receiving and comparing a reference voltage with the first voltage to output a comparison signal. The duty cycle calibration device is suitable for adjusting a duty cycle of the clock signal according to the comparison signal.

Another embodiment of the invention provides a memory system. The system comprises a memory and a memory controller suitable for controlling the memory. The memory controller comprises a duty cycle detector and a duty cycle calibration device. The duty cycle detector is suitable for detecting a value of a duty cycle of a clock signal and outputting a detection result. The duty cycle calibration device is suitable for adjusting the duty cycle of the clock signal according to the detection result.

Another embodiment of the invention provides a memory system. The system comprises a memory and a memory controller suitable for controlling the memory. The memory controller comprises a first I/O pad, a second I/O pad, a duty cycle calibration device and a duty cycle detector. The duty cycle calibration device is suitable for receiving and adjusting a duty cycle of a clock signal to output a calibrated clock signal, wherein the calibrated clock signal is transmitted to the memory via the first I/O pad. The duty cycle detector is suitable for receiving and detecting a value of a duty cycle of the calibrated clock signal via the second I/O pad and outputting a detection result, wherein the duty cycle calibration device adjusts the duty cycle of the clock signal according to the detection result.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
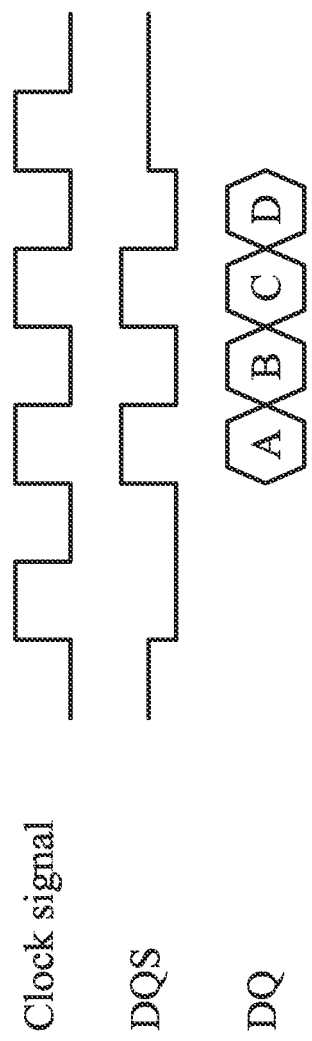
FIG. 1 is a timing diagram showing a DDR DRAM read operation with a balanced clock duty cycle.
Figure 2:
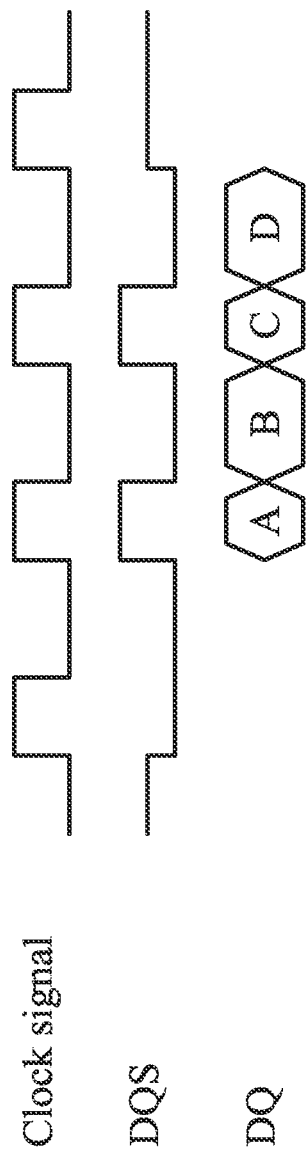
FIG. 2 is a timing diagram showing a DDR DRAM read operation with an unbalanced clock duty cycle.
Figure 3:
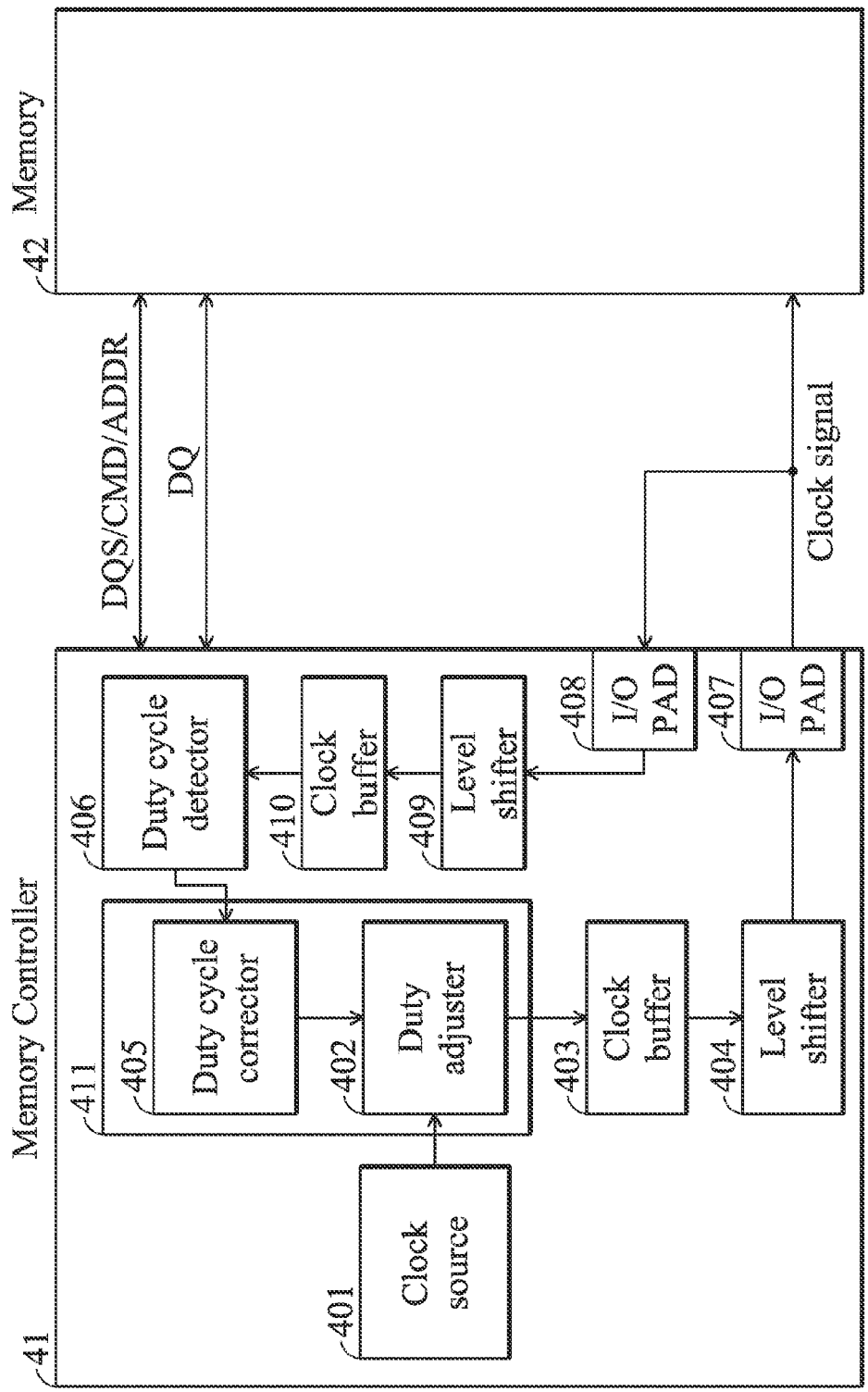
FIG. 3 is a block diagram of a memory system with a clock duty cycle adjusting mechanism according to one embodiment of the invention.

FIG. 3 is a block diagram of a memory system with a clock duty cycle adjusting mechanism according to one embodiment of the invention. The memory controller 41 includes a clock source 401, a duty cycle calibration device 411, a clock buffer 403, a level shifter 404, a duty cycle detector 406, an I/O pad 407, an I/O pad 408, a level shifter 409 and a clock buffer 410. The duty cycle calibration device 411 further comprises a duty cycle corrector 405 and a duty adjuster 402. The memory controller 41 is for controlling the memory 42.

The memory 42 may be a dynamic random access memory (DRAM), flash memory or any other type of memory requiring clock duty cycle accuracy.

The clock source 401 can be a phase-locked loop (PLL) or any other components suitable for generating a clock signal. Although the clock source 401 in this embodiment is a portion of the memory controller 41, the clock source 401 can be shared with other devices or modules that need clock signal. The clock source can also be located in other devices or modules, and transmitted to the memory controller 41 for it to utilize. The clock signal passes through the clock buffer 403 and the level shifter 404, and is transmitted to the memory 42 via the I/O pad 407. The level shifter 404 is utilized in this embodiment because the clock buffer 403 belongs to core power domain and the I/O pad 407 belongs to I/O power domain. If the difference between operation voltages of the components connecting to the level shifter is below a threshold, the level shifter can be omitted. The memory controller 41 transmits a command signal CMD and an address signal ADDR to the memory 42 to inform the memory 42 when reading or writing data. The memory 42 transmits the sampling signal DQS to the memory controller 41. The sampling signal DQS is generated according to the clock signal. During read operation, the memory controller 41 receives the data signal DQ from the memory 42. During write operation, the memory 42 receives the data signal DQ from the memory controller 41. The clock signal can be fed back to the memory controller 41 via the I/O pad 408.

Since the I/O power voltage may be different from the core power voltage, the level shifter 409 may be required for adjusting the DC level and/or amplitude of the clock signal. The duty cycle detector 406 is suitable for receiving the clock signal from the clock buffer 410 to detect a value of the duty cycle thereof and outputs a detection result to the duty cycle corrector 405. The duty cycle corrector 405 generates a duty cycle calibration signal according to the detection result, and the duty adjuster 402 adjusts the duty cycle of the clock signal according to the duty cycle calibration signal.

In some cases, the level shifter 409 and the clock buffer 410 may cause distortion of the clock signal during transmission from the I/O pad 408 to the duty cycle detector 406. Consequently, there may be difference between the clock signal sent to the memory 42 and the clock signal received by the duty cycle detector 406, and then the difference may affect the calibration accuracy. The difference between the clock signal sent to the memory 42 and the clock signal received by the duty cycle detector 406 may vary largely due to process, operation voltage and temperature variation.

Figure 4:
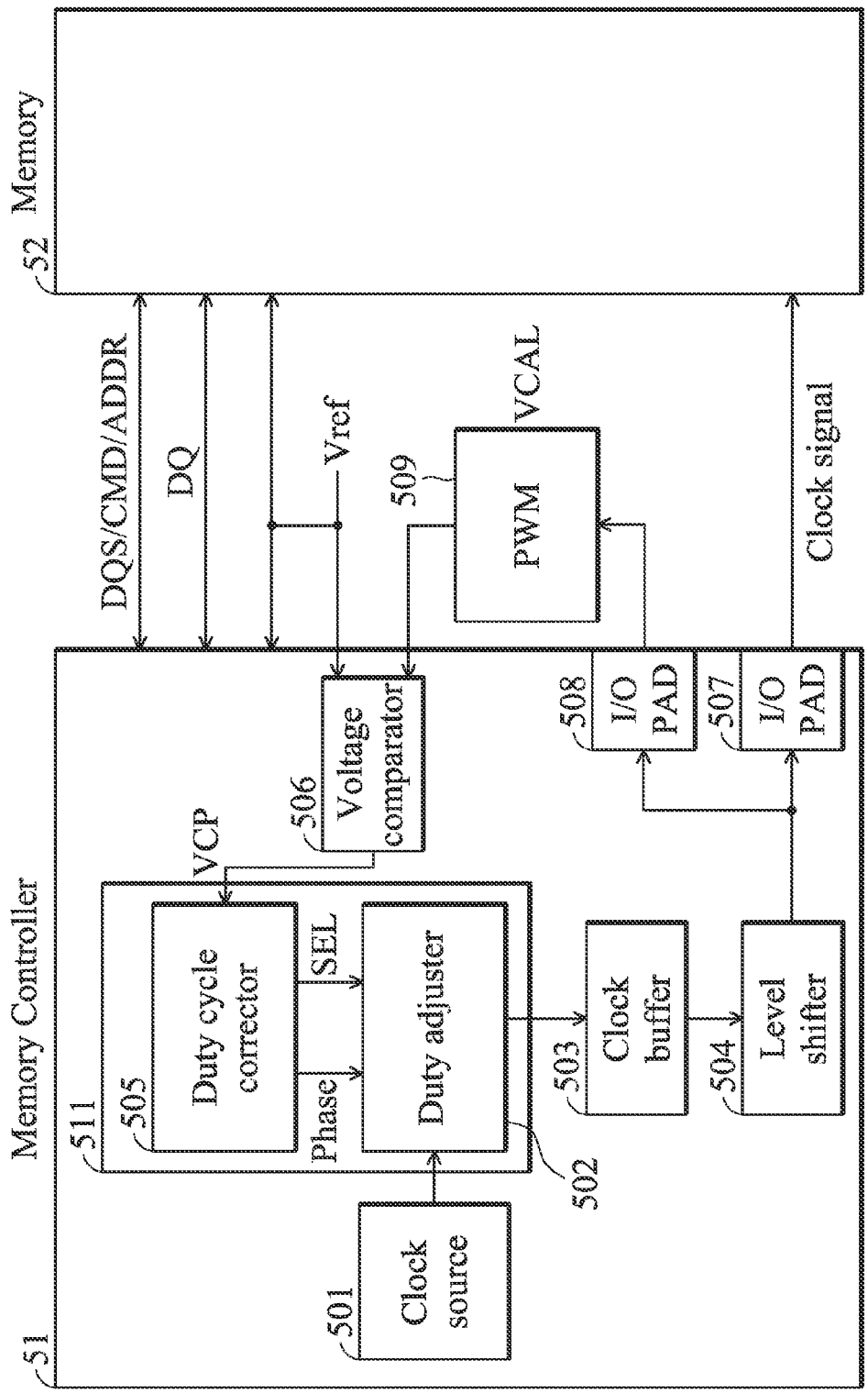
FIG. 4 is a block diagram of a memory system with a clock duty cycle adjusting mechanism according to another embodiment of the invention.

To reduce distortion during signal transmission, the present invention provides another embodiment of the memory system. FIG. 4 is a block diagram of a memory system with a clock duty cycle adjusting mechanism according to another embodiment of the invention. The memory controller 51 includes a clock source 501, a duty cycle calibration device 511, a clock buffer 503, a level shifter 504, a voltage comparator 506, I/O pads 507 and 508, and a PWM (pulse width modulation) module 509. The duty cycle calibration device 511 further comprises a duty cycle corrector 505 and a duty adjuster 502. The memory controller 51 is for controlling the memory 52. The memory 52 may be a DRAM, flash memory or any other type of memory requiring clock duty cycle accuracy.

The clock source 501 can be a phase-locked loop (PLL) or any other components suitable for generating a clock signal. Although the clock source 501 in this embodiment is a portion of the memory controller 51, the clock source 501 can be shared with other devices or modules that need clock signal. The clock source can also be located in other devices or modules, and transmitted to the memory controller 51 for it to utilize. The clock signal passes through the clock buffer 503 and the level shifter 504, and is transmitted to the memory 52 via the I/O pad 507. The level shifter 504 is utilized in this embodiment because the clock buffer 503 belongs to core power domain and the I/O pad 507 belongs to I/O power domain. If the difference between operation voltages of the components connecting to the level shifter is below a threshold, the level shifter can be omitted.

The memory controller 51 transmits a command signal CMD and an address signal ADDR to the memory 52 to inform the memory 52 when reading or writing data. The memory 52 transmits the sampling signal DQS to the memory controller 51. The sampling signal DQS is generated according to the clock signal. During read operation, the memory controller 51 receives the data signal DQ from the memory 52. During write operation, the memory 52 receives the data signal DQ from the memory controller 51. The reference voltage reference Vref is set according to the desired duty cycle of the sampling signal DQS. The PWM module 509 is suitable for receiving the clock signal to generate a voltage VCAL, which is one input signal of the voltage comparator 506. The voltage comparator 506 is suitable for receiving and comparing the reference voltage Vref with the voltage VCAL to output a comparison signal VCP to the duty cycle corrector 505.

It is noted that though the PWM module 509 shown in FIG. 4 is outside of the memory controller 51, however, the PWM module 509 can be integrated or embodied in the memory controller 51, or, in another embodiment, the PWM module 509 and the voltage comparator 506 can be elements outside the memory controller 51 to reduce circuitry complexity of the memory controller 51.

By using the PWM module 509 to generate the voltage VCAL, which is compared with the reference voltage Vref, the accuracy of the duty cycle comparison between the clock signal and an ideal signal with a target duty cycle can be increased. The PWM module 509 may use a rectangular wave having a pulse width that is modulated, such that the average value of the waveform is varied. If we consider a pulse wave f(t) with a low value $y_{min}$, a high value $y_{max}$ and a duty cycle D, the average value of the waveform is given as following:

$$\bar{y} = \frac{1}{T}\int_0^T f(t)dt$$

, wherein f(t) is a pulse wave, its value is $y_{max}$ for 0<t<D·T, and $y_{min}$ for D·T<t<T, wherein T is the cycle of f(t). The expression above then becomes:

$$\bar{y} = \frac{1}{T}\int_0^{D\cdot T} y_{max} dt + \int_{D\cdot T}^T y_{min} dt =$$
$$\frac{D\cdot T\cdot y_{max} + T(1-D)y_{min}}{T} = D\cdot y_{max} + (1-D)y_{min}$$

In the embodiment shown in FIG. 4, VCAL can be $\bar{y}$. When $y_{max}$ is VDDQ and $y_{min}$ is 0, VCAL is equal to D·VDDQ. Here VDDQ is an operation voltage of the memory controller 51 and/or memory 52. If the target duty cycle of the clock signal is, for example, 0.5 (50%) while $y_{max}$ is VDDQ and $y_{min}$ is 0, the target $\bar{y}$ will be VDDQ/2, and then the reference voltage Vref can be set as VDDQ/2. Then when VCAL is smaller than VDDQ/2, it means that the duty cycle of the clock signal is smaller than 50%. When VCAL is larger than VDDQ/2, it means that the duty cycle of the clock signal is larger than 50%. The voltage comparator 506 is suitable for comparing Vref and VCAL and then outputs the comparison signal VCP to the duty cycle corrector 505. Note that Vref is equal to VDDQ/2 in one embodiment, but the invention is not limited thereto. Vref varies according to target duty cycle and the operation voltage of the memory controller 51 and/or memory 52.

The duty cycle corrector 505 is suitable for generating a duty cycle calibration signal according to the comparison signal VCP and transmitting the duty cycle calibration signal to the. The duty adjuster 502 is suitable for adjusting the duty cycle of the clock signal output from the clock source 501 according to the duty cycle calibration signal. The duty cycle calibration signal may include a phase signal and a select signal SEL. The phase signal can represent a duty cycle calibration amount, such as an increased or decreased amount of the duty cycle. The select signal SEL can indicate that the duty cycle of the clock signal is larger than or less than a target duty cycle, thus has to be decreased or increased.

Figure 5:
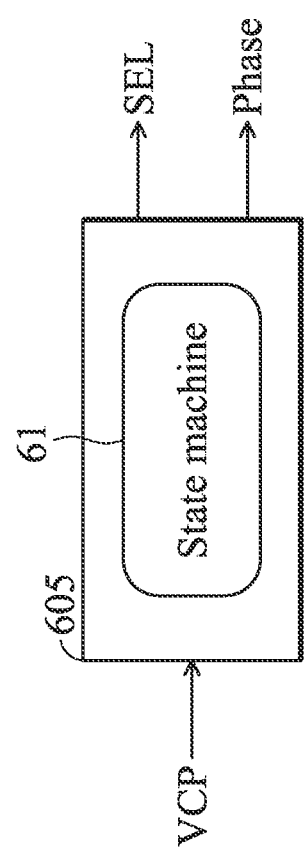
FIG. 5 is a block diagram of the duty cycle corrector according to an embodiment of the invention.

FIG. 5 is a block diagram of the duty cycle corrector 605 according to an embodiment of the invention. The duty cycle corrector 605 may include a state machine 61 which may be implemented by software, hardware or a combination thereof The state machine 61 is suitable for receiving the comparison signal VCP and generating the select signal SEL and the phase signal. The select signal SEL may indicate that the duty cycle of the clock signal is larger than or less than a target duty cycle such as 50%. The phase signal may represent the shifted amount of the duty cycle. The duty cycle corrector 605 transmits the select signal SEL and the phase signal to the duty adjuster for adjusting the duty cycle of the clock signal output from the clock source.

Figure 6:
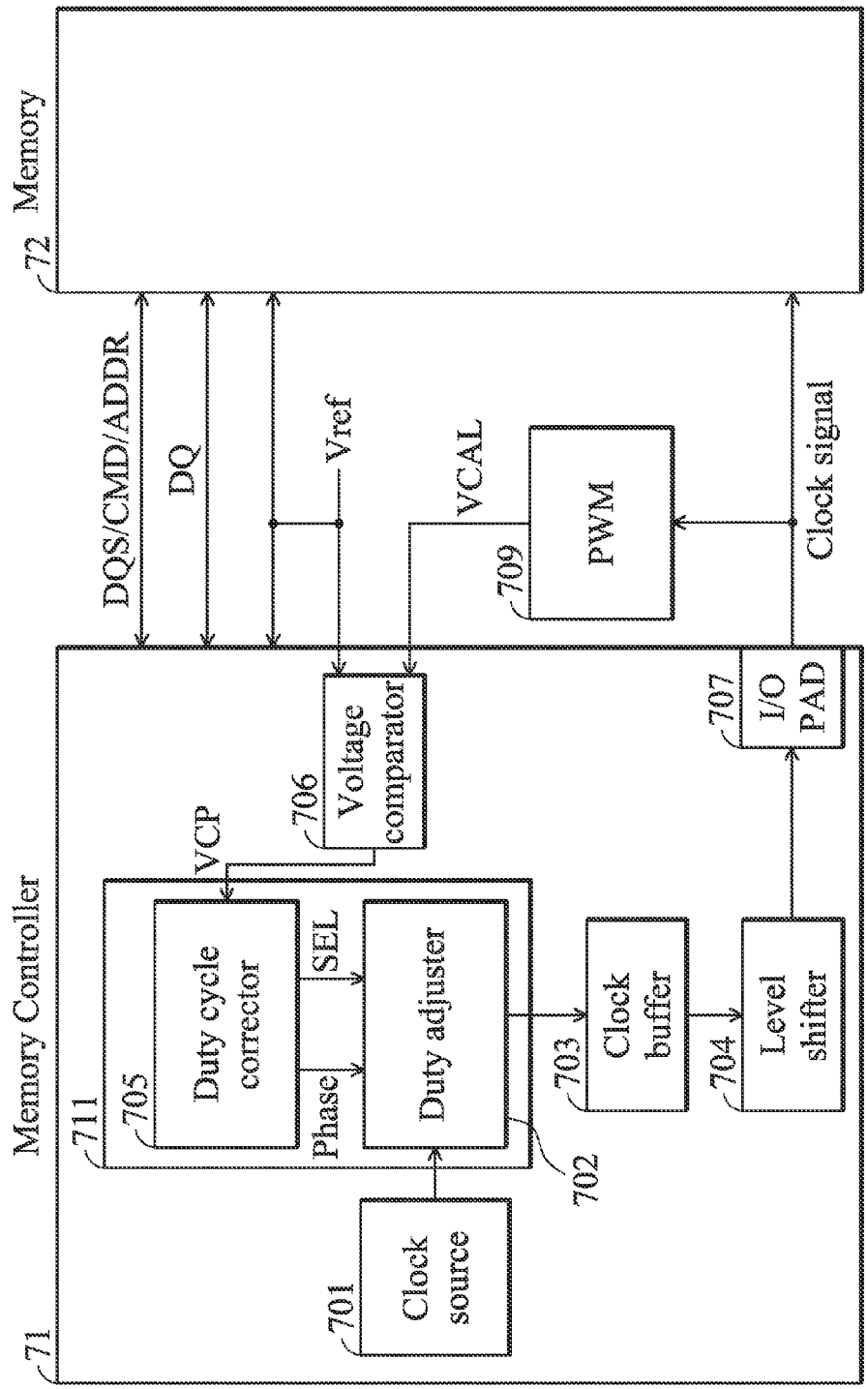
FIG. 6 is a block diagram of a memory system with a clock duty cycle adjusting mechanism according to another embodiment of the invention.

FIG. 6 is a block diagram of a memory system with a clock duty cycle adjusting mechanism according to another embodiment of the invention. The memory controller 71 includes a clock source 701, a duty cycle calibration device 711, a clock buffer 703, a level shifter 704, a voltage comparator 706, an I/O pad 707, and a PWM (pulse width modulation) module 709. The duty cycle calibration device 711 further comprises a duty cycle corrector 705 and a duty adjuster 702. The memory controller 71 is for controlling the memory 72. The memory 72 may be a DRAM, flash memory or any other type of memory requiring clock duty cycle accuracy.

The memory controller 71 is for controlling the memory 72. The clock source 701 can be a phase-locked loop (PLL) or any other components suitable for generating a clock signal. Although the clock source 701 in this embodiment is a portion of the memory controller 71, the clock source 701 can be shared with other devices or modules that need clock signal. The clock source can also be located in other devices or modules, and transmitted to the memory controller 71 for it to utilize. The clock signal passes through the clock buffer 703 and the level shifter 704, and is transmitted to the memory 72 via the I/O pad 707. The level shifter 704 is utilized in this embodiment because the clock buffer 703 belongs to core power domain and the I/O pad 707 belongs to I/O power domain. If the difference between operation voltages of the components connecting to the level shifter is below a threshold, the level shifter can be omitted.

The memory controller 71 transmits the clock signal to the memory 72. The memory controller 71 transmits a command signal CMD and an address signal ADDR to the memory 72 to inform the memory 72 when reading or writing data. The memory 72 transmits a sampling signal DQS to the memory controller 71. The sampling signal DQS is generated according to the clock signal. During read operation, the memory controller 71 receives the data signal DQ from the memory 72. During write operation, the memory 72 receives the data signal DQ from the memory controller 71. The reference voltage reference Vref is set according to the desired duty cycle of the sampling signal DQS. The PWM module 709 is suitable for receiving the clock signal to generate a voltage VCAL, which is one input signal of the voltage comparator 706. The voltage comparator 706 is suitable for receiving and comparing the reference voltage Vref with the voltage VCAL to output a comparison signal VCP to the duty cycle corrector 705.

The operation of the PWM module 709 and duty cycle corrector 705 is similar to the operation of the PWM module 509 and duty cycle corrector 505, thus, detailed descriptions thereof are omitted here for brevity. Compared with the memory system of FIG. 4, the I/O pad 508 in FIG. 4 is removed, then the distortion between the input of the duty cycle corrector 705 and the clock signal transmitted to the memory 72 can be reduced. By using the PWM module 709 to generate the voltage VCAL, which is compared with the reference voltage Vref, the accuracy of the duty cycle comparison between a clock signal and an ideal signal with a target duty cycle can be increased.

Figure 7:
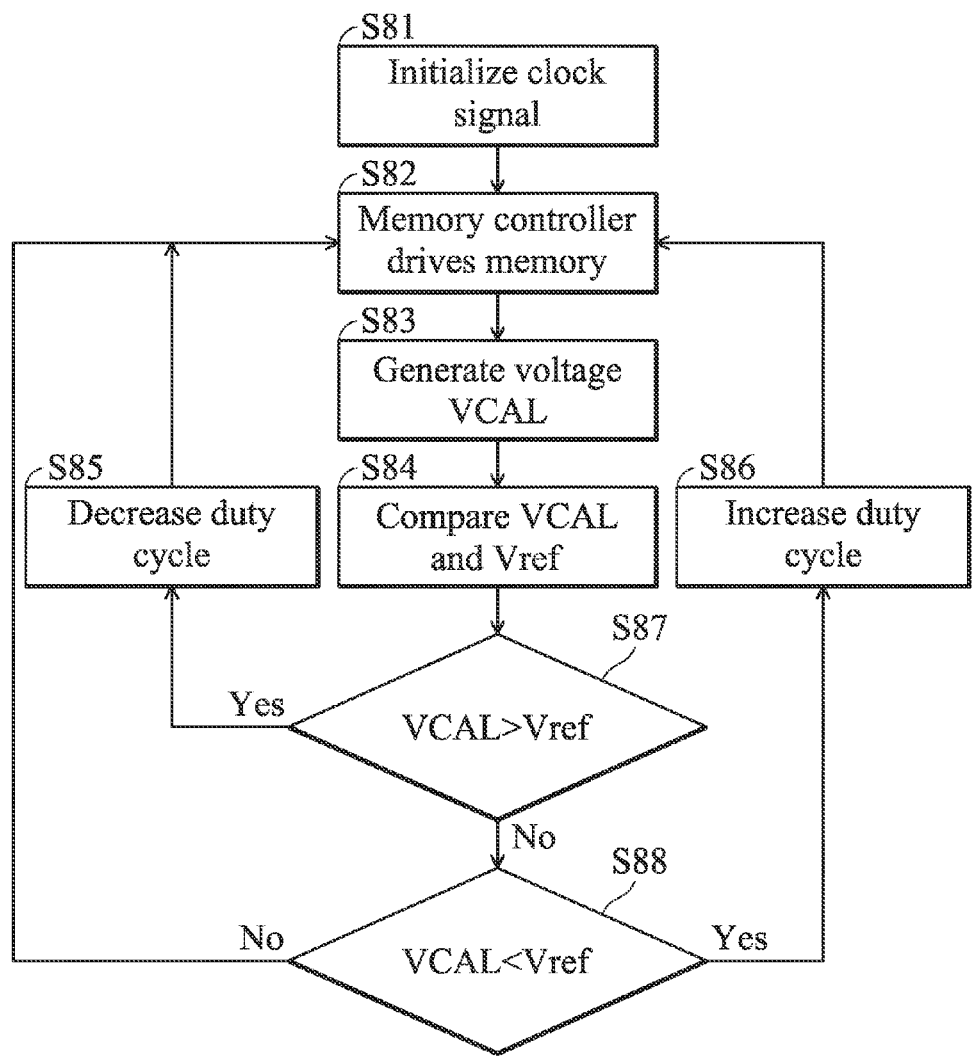
FIG. 7 is a flowchart of a clock duty cycle adjusting method for a memory clock signal according to one embodiment of the invention.

FIG. 7 is a flowchart of a clock duty cycle adjusting method for a clock signal according to one embodiment of the invention. In step S81, the memory controller initializes the clock signal. After initializing. In step S82, the memory controller drives the memory with the clock signal and the clock signal is also transmitted to a PWM module. In step S83, the PWM module may receive the clock signal to generate a voltage VCAL by, for example, using a formula. In step S84, a voltage comparator can be applied to compare the voltage VCAL with a reference voltage Vref. In steps S87 and S88, it is determined that whether the voltage VCAL is larger than or less than the reference Vref. If the voltage VCAL is larger than the reference voltage Vref, step S85 is then executed and the duty cycle of the clock signal is decreased. If the voltage VCAL is smaller than the reference voltage Vref, step S86 is then executed and the duty cycle of the clock signal is increased. After steps S85 and S86, the procedure returns to step S82 to repeat the duty cycle adjusting until the duty cycle of the clock signal matches the target duty cycle. Please not that the execution order of the steps described above is not limited to the order illustrated in FIG. 7 and can be modified according to different requirements. Besides, one or more steps described above can be omitted according to different requirements.

Figure 8:
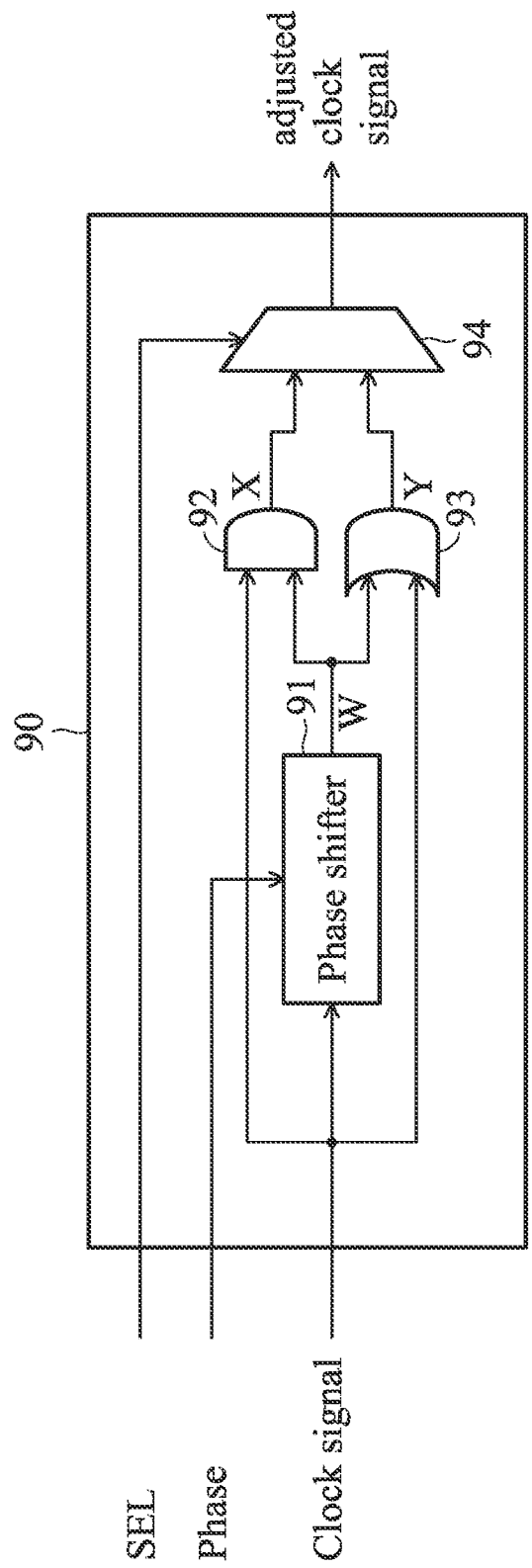
FIG. 8 is a schematic diagram of a duty adjuster according to an embodiment of the invention.

For further illustration of duty adjuster and duty cycle detector, please refer to FIGS. 8-11. FIG. 8 is a schematic diagram of a duty adjuster 90 according to an embodiment of the invention. The duty adjuster 90 receives the select signal SEL and the phase signal from the duty cycle corrector and clock signal from the clock source. The duty adjuster 90 may include a phase shifter 91, AND gate 92, OR gate 93 and multiplexer 94. The phase shifter 91 receives the clock signal and shifts it to generate signal W according to the phase signal. The phase signal may represent a duty cycle calibration amount, such as the amount of shift of the phase. The AND gate 92 may receive the clock signal and the shifted clock signal W and apply a logic AND operation on the both signals to generate a signal X. The OR gate 93 may receive both the clock signal and the shifted clock signal W and apply a logic OR operation on the both signals to generate a signal Y. The multiplexer 94 may receive signals X and Y and select one of X and Y to be served as the adjusted clock signal according to the select signal SEL.

Figure 9:
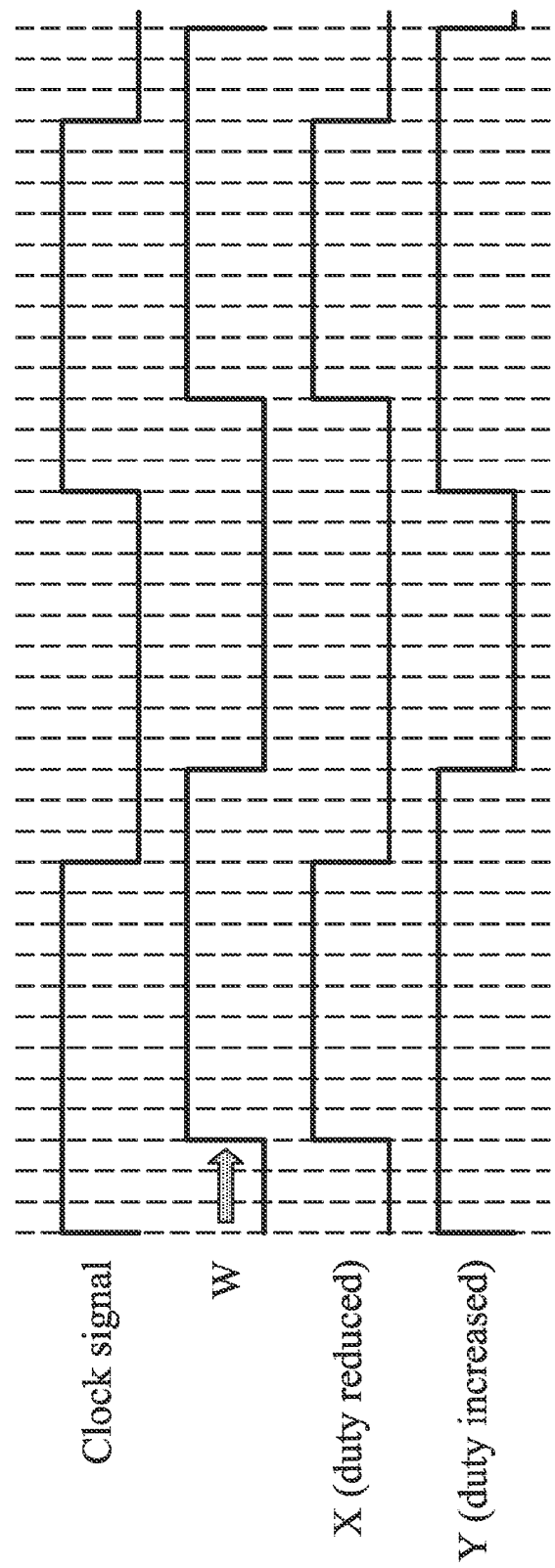
FIG. 9 is a waveform illustrating exemplary operation of the duty adjuster of FIG. 9.

For further illustration, pleases refer to FIG. 9. FIG. 9 is a waveform illustrating exemplary operation of the duty adjuster of FIG. 8 according to one embodiment of the invention. In this embodiment, the signal W is generated by shifting the clock signal by, for example, 90 degrees by the phase shifter 91. The signal W is then input to the AND gate 92 and OR gate 93 to generate the signal X and signal Y. The signal X represents the clock signal with decreased duty cycle and signal Y represents the clock signal with increased duty cycle. The multiplexer 94 receives the signals X and Y and outputs the adjusted clock signal according to the select signal SEL, wherein the increased amount of the duty cycle of signal Y is the same as the decreased amount of the duty cycle of signal X. According to the above descriptions, it is known that the phase signal is used in generating two clock signals with the same duty cycle adjusting amount and the select signal SEL is used in selecting a clock signal with an increased duty cycle or decreased duty cycle to be served as the adjusted clock signal.

Figure 10:
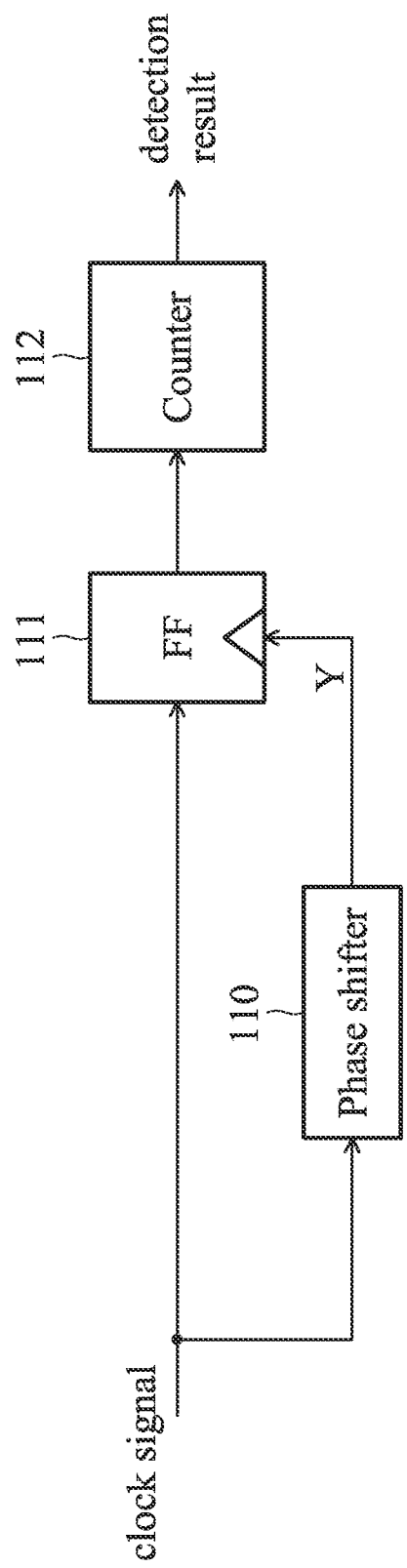
FIG. 10 is a functional block diagram of a duty cycle detector according to an embodiment of the invention.

FIG. 10 is a functional block diagram of a duty cycle detector according to an embodiment of the invention. The clock signal is transmitted to the flip-flop 111 and the phase shifter 110. The phase shifter 110 shifts the clock signal to generate and transmit a shifted signal Y to be served as the input clock of flip-flop 111. The counter 112 receives the output signal of flip-flop 111 and counts the numbers of at least one of logic "1" and "0" to detect the value of duty cycle of the clock signal. Then the detection result is output from the duty cycle detector. For example, if the counter 112 obtains 111110000 from the output signal of the flip-flop 111, the duty cycle is 50%. If the counter 112 obtains 111100000 from the output signal of the flip-flop 111, the duty cycle is 40%.

Figure 11:
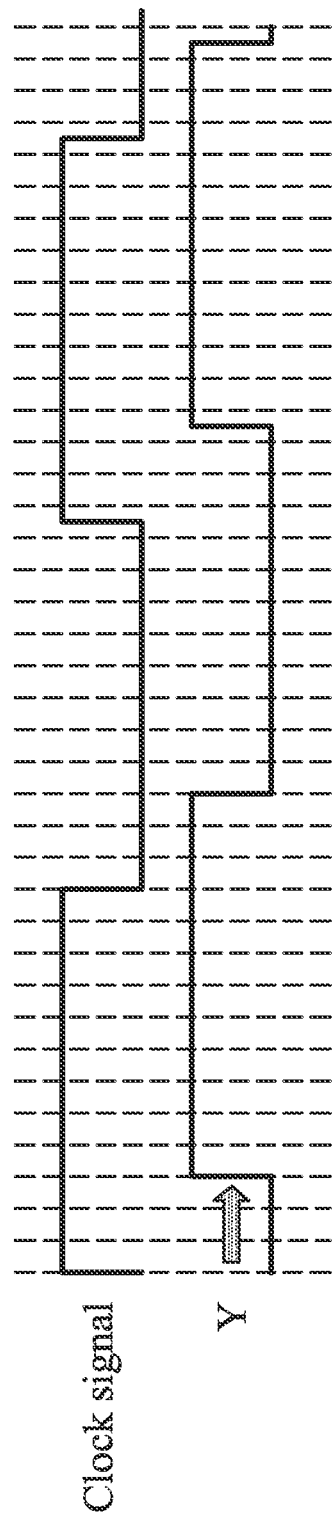
FIG. 11 is a waveform of an exemplary operation of the duty cycle detector of FIG. 10.

FIG. 11 is a waveform of an exemplary operation of the duty cycle detector of FIG. 10. In FIG. 11, the clock signal is shifted by, for example, 90 degrees to generate the signal Y. The output of the flip-flop 111 may include a plurality of logic "1" and logic "0", and the counter 112 counts the number of logic "1" and logic "0" to detect value of the duty cycle.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller for controlling a memory, comprising:
   a pulse width modulation module suitable for receiving a clock signal to generate a first voltage;
   a voltage comparator suitable for receiving and comparing a reference voltage with the first voltage to output a comparison signal; and
   a duty cycle calibration device suitable for adjusting a duty cycle of the clock signal according to the comparison signal;
   wherein the duty cycle calibration device comprises a duty cycle corrector suitable for generating a duty cycle calibration signal according to the comparison signal, and wherein the duty cycle calibration signal comprises a phase signal that represents a duty cycle calibration amount, and a select signal which indicates that the duty cycle of the clock signal is larger than or less than a target duty cycle.

2. The controller as claimed in claim 1, wherein the duty cycle calibration device further comprises:
   a duty adjuster suitable for adjusting the duty cycle of the clock signal according to the duty cycle calibration signal.

3. The controller as claimed in claim 1, wherein the reference voltage is set according to a target duty cycle.

4. The controller as claimed in claim 3, wherein the target duty cycle is 50%.

5. The controller as claimed in claim 1, further comprising a level shifter suitable for adjusting a voltage level of the clock signal.

6. The controller as claimed in claim 1, wherein the clock signal is transmitted to the memory via a first I/O pad and transmitted to the pulse width modulation module via a second I/O pad.

7. The controller as claimed in claim 1, wherein the reference voltage is half of an operation voltage of the memory controller.

8. The controller as claimed in claim 1, wherein the memory provides a sampling signal to the memory controller.

9. The controller as claimed in claim 8, wherein the sampling signal is generated according to the clock signal.

* * * * *